United States Patent [19]
Takeda et al.

[11] 3,999,125
[45] Dec. 21, 1976

[54] PEAK DETECTOR HAVING SIGNAL RISE-TIME ENHANCEMENT

[75] Inventors: Masashi Takeda, Isehara; Atsushi Matsuzaki, Yokohama, both of Japan

[73] Assignee: Sony Corporation, Tokyo, Japan

[22] Filed: Apr. 22, 1975

[21] Appl. No.: 570,359

[30] Foreign Application Priority Data
Apr. 25, 1974 Japan ............................ 49-46943

[52] U.S. Cl. ........................ 324/103 P; 324/125; 307/235 A
[51] Int. Cl.² ...................................... G01R 19/16
[58] Field of Search .......... 324/103 R, 103 P, 125; 330/86; 307/235 A; 328/150, 151

[56] References Cited
UNITED STATES PATENTS

| | | | |
|---|---|---|---|
| 2,567,688 | 9/1951 | Bigelow | 324/125 X |
| 3,259,760 | 7/1966 | Morey et al. | 324/103 P X |
| 3,458,821 | 7/1969 | Clarridge | 330/86 UX |
| 3,541,457 | 11/1970 | Leighty et al. | 324/103 P X |
| 3,712,989 | 1/1973 | Barton | 328/150 X |
| 3,729,666 | 4/1973 | Kelly | 330/86 UX |
| 3,758,792 | 9/1973 | Heuner et al. | 328/151 X |
| 3,846,692 | 11/1974 | Hill | 324/103 P X |
| 3,863,152 | 1/1975 | Wernitz | 324/125 X |

*Primary Examiner*—Gerard R. Strecker
*Attorney, Agent, or Firm*—Lewis H. Eslinger; Alvin Sinderbrand

[57] ABSTRACT

A peak detector having rise-time enhancement of input signals is comprised of a feedback amplifier including two input terminals and a feedback circuit which interconnects the amplifier output terminal with one of the input terminals; and a peak detecting circuit, including a capacitor, coupled to the other of the amplifier input terminals. The capacitor voltage is applied as an input signal to the feedback amplifier, and abrupt changes in the rise-time portion of the input signals are detected and are used to vary the amplifier feedback so as to enhance the output signal produced by the amplifier during the rise-time portion.

12 Claims, 4 Drawing Figures

PEAK DETECTOR HAVING SIGNAL RISE-TIME ENHANCEMENT

BACKGROUND OF THE INVENTION

This invention relates to a peak detector and, more particularly, to a peak detector having rise-time enhancement of input signals.

Peak detector circuits are used in various applications wherein it is desired, or necessary, to sense or be provided with an indication of the peak levels of an input signal. A typical peak detector circuit is formed of a diode connected to a capacitor, whereby the capacitor can be charged unidirectionally in response to increasing levels in the input signal applied to the diode. Generally, this type of peak detector has a relatively low rise-time constant so that the capacitor can be rapidly charged in response to increasing signal levels; but has a relatively long fall-time constant so that the capacitor is discharged at a relatively slow rate when the instantaneous input signal level falls below the level stored by the capacitor.

In one typical application of such a peak detector, a peak level meter is used having, for example, an indicating needle which is deflected in accordance with the output voltage of the peak detector. One use of such a peak level meter is to provide indications, or measurements, of the level of a sound generating signal. Such a meter can advantageously be used in sound reproducing systems, such as high fidelity, stereophonic sound processing apparatus.

When the peak level meter is used to indicate sound levels, it is necessary for the indicating needle to reliably follow variations in the peak level of the sound signal, even when the sound signal is a music signal whose level is subject to abrupt changes. In view of the mechanical time constants of the indicating needle and its associated energizing devices, it is appreciated that the needle often cannot follow such abrupt changes in the sound signal. That is, the peak levels of the signal might change too rapidly for the meter to correspondingly follow. Accordingly, it would be necessary to provide a driving circuit for the peak level meter so that abrupt changes of the input signal are enhanced over the normal, or slowly varying input signal. It is thought that if the abrupt changes are so enhanced, or additionally amplified, the indicating needle would be driven in response to such higher level signals, notwithstanding its relatively high mechanical time constant.

A proposed driving circuit for such a peak level meter would include an amplifier, such as an operational amplifier, for supplying the voltage stored on the capacitor of the peak detector to the meter. If a capacitor is provided in the output circuit of the amplifier, abrupt changes in the input signal are detected and a voltage component proportional to such abrupt change is added to the amplified input signal. Thus, during such abrupt changes, the meter would be provided with a first component proportional to the abruptly changed input signal and a second component, added to the first, which is proportional to the abrupt change itself.

Unfortunately, although the abrupt change in the input signal is enhanced by such a peak detector, if the enhancement of the rise-time portion is to be changed, for example, to accommodate faster changes, the characteristics of the entire meter driving circuit are likewise varied. Such variation would require compensation, as by adjusting other parameters so that, in the absence of abrupt changes, the meter nevertheless provides an indication which is an accurate representation of the input signal levels. Consequently, it would be necessary to adjust various circuit parameters for each adjustment in the rise-time enhancement circuit.

OBJECTS OF THE INVENTION

Therefore, it is an object of the present invention to provide an improved peak detector having input signal rise-time enhancement It is another object of this invention to provide an improved peak detector wherein the rise-time enhancement can be changed, as desired, without affecting the detector output signal level for those instances wherein the input signal does not undergo abrupt changes.

It is a further object of this invention to provide an improved peak detector having input signal rise-time enhancement which can be easily used with a peak level meter.

Yet a further object of this invention is to provide a peak detector for use with a peak level meter wherein the meter is driven to accurately indicate rapid variations in the peak levels of an input signal.

Various other objects and advantages of the present invention will become apparent from the forthcoming detailed description, and the novel features will be particularly pointed out in the appended claims.

SUMMARY OF THE INVENTION

In accordance with this invention, a peak detector having input signal rise-time enhancement is provided, comprising a feedback amplifier wherein a feedback circuit establishes a feedback path between the amplifier output terminal and one of a pair of amplifier input terminals; the other amplifier input terminal being connected to a peak detecting circuit which includes a capacitor, the capacitor being charged by signals of a predetermined polarity; and wherein abrupt changes in the rise-time portion of the input signals which are applied to the capacitor are used to vary the feedback circuit so as to enhance the output signal produced by the amplifier during the rise-time portion of the changing input signal.

BRIEF DESCRIPTION OF THE DRAWINGS

The following detailed description will best be understood in conjunction with the accompanying drawings in which.

DETAILED DESCRIPTION OF CERTAIN ONES OF THE PREFERRED EMBODIMENTS

Figure 1:
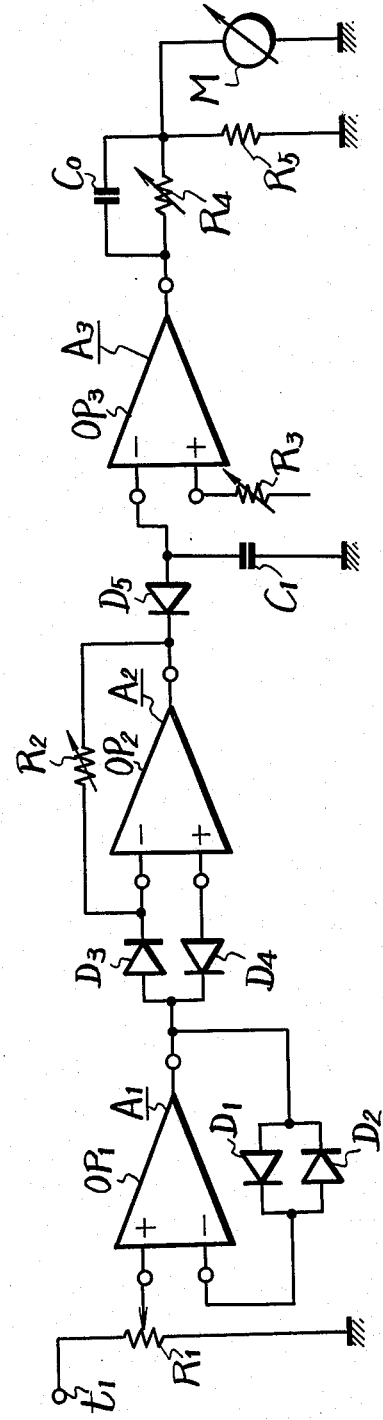
FIG. 1 is a schematic diagram of a proposed rise-time enhanced peak detector.

Referring now to the drawings, and in particular to FIG. 1, a schematic diagram of a proposed peak detector having input signal rise-time enhancement is illustrated for use in cooperation with a peak level meter M. The circuit is shown as having a plurality of amplifier stages $A_1$ and $A_2$, a peak detecting circuit formed of a diode $D_5$ and a capacitor $C_1$, a driving output amplifier $A_3$ and a rise-time enhancement circuit including a capacitor $C_0$ and a resistor $R_4$. An input signal, such as an audio signal, is applied across a variable resistor $R_1$ via an input terminal $t_1$. The variable resistor $R_1$ may be a potentiometer having a movable tap and serves to permit an adjustment in the OdB indication on the meter M. The movable tap of the potentiometer is connected to the amplifier stage $A_1$ which is connected as a logarithmic amplifier formed of an operational amplifier $OP_1$ and a feedback circuit formed of the parallel connection of oppositely poled diodes $D_1$ and $D_2$, as shown. The logarithmic amplifier stage $A_1$ serves to establish a dynamic range of, for example −50 dB to +5 dB.

The output of the logarithmic amplifier $A_1$ is supplied through a pair of diodes $D_3$ and $D_4$, which form a full-wave rectifier circuit, to the amplifier stage $A_2$. This stage is formed of an operational amplifier $OP_2$ having a negative feedback circuit including the variable resistor $R_2$ which is provided to enable an operator to effect an adjustment in the scale indication of the meter M. The output of the amplifier stage $A_2$ is connected to the peak detecting circuit formed of the diode $D_5$ and capacitor $C_1$. As is evident, the diode $D_5$ is poled in a direction such that the capacitor $C_1$ can be charged in the negative direction. That is, peak signals of negative polarity serve to charge the capacitor $C_1$. The capacitor can be rapidly charged in response to negative peaks to store such negative peak levels, and will be slowly discharged when the signal applied to the peak detecting circuit is less than the charged level of the capacitor.

The peak detecting circuit is connected to an input terminal of the driving amplifier $A_3$ which is formed of an operational amplifier $OP_3$ and, in the illustrated configuration, includes an inverting input coupled to the peak detecting circuit and a non-inverting input coupled to other circuitry, which is not shown in detail. A variable resistor $R_3$ serves to connect such other circuitry to the operational amplifier $OP_3$ and is adjustable to provide a null adjustment in the meter M. The output of the driving amplifier stage $A_3$ is connected through a voltage divider formed on the series-connected resistors $R_4$ and $R_5$ to the meter M, as shown. The resistor $R_4$ is adjustable and includes a capacitor $C_0$ in parallel therewith.

In analyzing the circuit of FIG. 1, it will be appreciated that, in the absence of the capacitor $C_0$, the voltage across the resistor $R_5$ and applied to the meter M is an amplified version of the peak levels which are stored on the capacitor $C_1$. With the addition of the capacitor $C_0$, an additional component is added to the voltage across the resistor $R_5$. This additional component is proportional to the abrupt changes in the peak levels which are applied to the capacitor $C_1$. That is, a voltage component proportional to $dV/dt$, which represents the abrupt change in the input signal level. Thus, the voltage applied to the meter M when the input signal undergoes such variations is proportional to $V+dV/dt$. Consequently, if the input signal rapidly varies, the meter M is provided with an additional voltage component so that, even though the mechanical time constant of the meter would not accurately follow the changing voltage V, the additional component $dV/dt$ is sufficiently high to drive the meter so that the indicating needle is proportionately deflected.

Of course, the resistor $R_4$ and the capacitor $C_0$ exhibit a time constant. In some instances, this time constant might be too high with respect to the change, or rise-time, of the input signal which is applied to the amplifier $A_3$. In that event, the additional component attributed to this circuit and added to the meter M will not be sufficient to suitably drive the indicating needle. Accordingly, it is necessary to enable the resistor $R_4$ to be adjustable so as to change the time constant of the circuit and thus accommodate faster varying input signals. However, as can be seen, if the resistor $R_4$ is adjusted, the peak detector circuit parameters are correspondingly changed. Thus, the meter M might not provide an accurate indication of the peak level of the audio signal applied to terminal $t_1$ when the audio signal is not rapidly changed. Hence, although the rise-time portion of the audio input signal might be suitably enhanced to permit the meter M to provide an accurate indication of such rapidly changing audio signal, the meter will not provide a reliable proportionate indication of the audio input signal for those times when the audio signal is not rapidly varying. Consequently, for each adjustment in the resistor $R_4$ to accommodate different rist-time portions, further adjustments to the resistors $R_1$ and $R_2$ would be necessary to obtain accurate meter indications.

Figure 2:
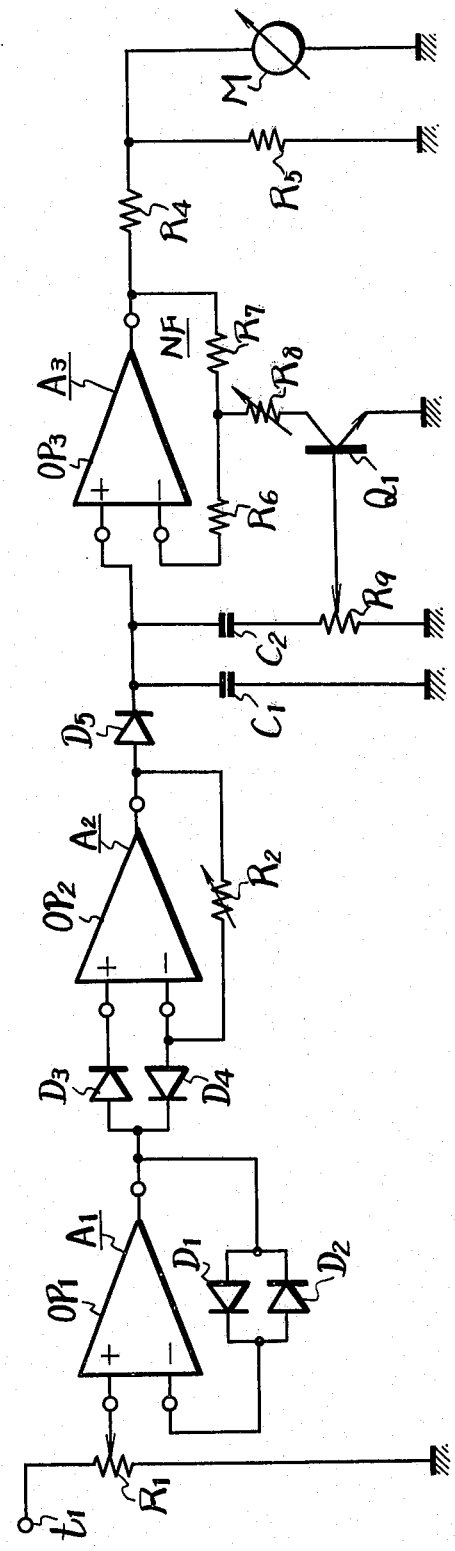
FIG. 2 is a schematic diagram of one embodiment of the peak detector in accordance with the present invention.

These defects of the peak detector illustrated in FIG. 1 are overcome by the present invention, one embodiment of which being shown in FIG. 2. The peak detector illustrated in FIG. 2 is comprised of plural amplifier stages $A_1$ and $A_2$ which are disposed between an input terminal $t_1$ and a peak detecting circuit formed of a diode $D_5$ and a capacitor $C_1$, which is analogous to the corresponding stages previously described with respect to FIG. 1. However, as is apparent, the full-wave rectifying circuit formed of the diodes $D_3$ and $D_4$, and the direction in which the diode $D_5$ is poled indicates that the capacitor $C_1$ included in the peak detecting circuit is adapted to be charged by signals of positive polarity. That is, the voltage stored across the capacitor $C_1$ represents the positive peak levels of the audio input signal applied to the terminal $t_1$. Hence, if the signal level of the audio input signal drops below the voltage to which the capacitor $C_1$ has been charged, the capacitor is permitted to slowly discharge. Conversely, when the signal level of the audio input signal exceeds the charged level of the capacitor $C_1$, the diode $D_5$ is forward-biased to thus additionally charge the capacitor to a level proportional to the peak input level of the audio input signal.

The driving amplifier stage $A_3$ is comprised of an operational amplifier $OP_3$ having a negative feedback circuit NF interconnected between the output terminal of the operational amplifier and one of its pair of input terminals. As shown, the negative feedback circuit is formed of series-connected resistors $R_6$ and $R_7$ which are coupled to, for example, the inverting input terminal of the operational amplifier. The junction defined by these feedback resistors is coupled to a variable impedance element here formed of the collector-emitter circuit of a transistor $Q_1$. As particularly shown, the collector electrode of the transistor is connected, through a variable resistor $R_8$, to the junction defined by the feedback resistors, and the emitter electrode of the transistor is connected to a reference potential, such as ground. It should be apparent that, as a signal is applied to the base electrode of the transistor $Q_1$, the collector-emitter impedance thereof is adapted to vary. This variation in the impedance of the transistor $Q_1$ correspondingly varies the feedback impedance of the amplifier stage $A_3$. When the transistor $Q_1$ is fully conductive, the feedback path established by the feedback resistors $R_6$ and $R_7$ is shunted to ground through the resistor $R_8$ and the conducting transistor $Q_1$. Hence, in this mode, the negative feedback circuit NF is interrupted.

In the circuit illustrated in FIG. 2, the conductivity of the transistor $Q_1$ is a function of the voltage applied to the capacitor $C_1$ and, in particular, is a function of the changes in such voltage. That is, transistor $Q_1$ is rendered conductive, and its conductivity is increased, when the voltage applied to the capacitor $C_1$ undergoes rapid variations. Accordingly, the control of the transistor $Q_1$ is achieved by a differentiator circuit connected in parallel with the capacitor $C_1$, the differentiator circuit here being formed of the series connection of a capacitor $C_2$ and a resistor $R_9$. The resistor $R_9$ is a variable resistor, such as a potentiometer, for a purpose soon to be described. Accordingly, the movable tap of such a potentiometer is connected to the base electrode of the transistor $Q_1$.

The output of the feedback amplifier stage $A_3$ is coupled through a voltage divider formed of the resistors $R_4$ and $R_5$ to supply the output voltage amplified by the amplifier $A_3$ to the meter M which, in turn, is connected across the output of the voltage divider circuit. As shown, the meter is connected in parallel with the resistor $R_5$. Preferably, the meter M is provided with a critical damping or may be overdamped.

In operation, it is appreciated that the voltage stored by the capacitor $C_1$ is supplied to, for example, the non-inverting input of the feedback amplifier $A_3$, and is amplified and applied to the meter M. The meter is thus driven by the amplified voltage to provide an indication of the peak level of the input audio signal which is applied to the terminal $t_1$. It is, of course, appreciated that the capacitor $C_1$ is charged to the positive peak levels of the audio input signal. Accordingly, as the audio input signal is varied, the capacitor $C_1$ supplies such changing peak levels through the amplifier $A_3$ to the meter M. Assuming these changes in the peak levels of the audio input signal do not exceed the mechanical time constant of the meter M, the indicator needle thereof is capable of following such peak level changes.

Now, if the audio input signal undergoes an abrupt change in its peak level, the voltage applied to the capacitor $C_1$ by the diode $D_5$ is correspondingly changed. Since this change in the voltage peak can be represented as $dV/dt$, it is seen that the current through the capacitor $C_1$ is increased and the voltage applied to the capacitor $C_2$ is rapidly changed. The differentiator circuit formed of the capacitor $C_2$ and the resistor $R_9$ detects this rapid change in the voltage applied to the capacitor $C_1$ to thus produce a high voltage across the resistor $R_9$. A portion of this high voltage across the resistor $R_9$ is derived by the particular position of the adjustable tap and is supplied to actuate the transistor $Q_1$. As the base emitter voltage of the transistor is increased, this transistor is turned ON, whereby its collector-emitter impedance is reduced. Consequently, the feedback path established by the feedback circuit NF is effectively shunted to ground so as to interrupt such feedback, thereby enabling the amplification factor of the amplifier $A_3$ to be significantly increased. Accordingly, the rise-time portion of the input signal which now is being amplified by the amplifier $A_3$ is substantially enhanced and supplied to the meter M. Therefore, the indicating needle of the meter is suitably driven so that, even though the rise time portion of the audio signal is less than the mechanical time constant of the meter, the enhanced voltage applied to the meter results in a proportionate deflection of the needle to thus follow the abrupt change in the audio signal peak level.

It is appreciated that the adjustable tap on the resistor $R_9$ can be adjusted so that a desired portion of the differentiated voltage produced across the resistor $R_9$ can be supplied to the base electrode of the transistor $Q_1$. Thus, by adjusting the resistor $R_9$ and/or by adjusting the resistor $R_8$, sharper rise-time portions of the audio input signal can be accommodated. That is, the peak detector can be made more sensitive to faster rise-times so as to be able to enhance these faster rise-times and suitably drive the meter M in response thereto. Advantageously, since the resistors $R_8$ and $R_9$ are not disposed in the audio signal input path, changes in these resistors do not affect the meter indication for audio signals which do not undergo such abrupt changes. Accordingly, even though these resistors may be adjusted to accommodate faster rise-time portions of audio input signals, the meter M will provide accurate indications of audio input signals which do not undergo abrupt changes or which undergo slower variations. Thus, the resistors $R_1$ and $R_2$ need not be adjusted to compensate for each adjustment to the resistors $R_8$ and/or $R_9$. The illustrated peak detector enables the meter to properly follow rapid changes in the audio signal peaks as well as provide accurate indications of slower variations in such signal peaks. Furthermore, since the output resistance of the amplifier $A_3$ is very low, the damping effect on the indication needle of the meter M is very large. Also, the capacitor $C_2$ may exhibit a relatively small capacitance in comparison with that of the capacitor $C_0$ of FIG. 1. This means that the time constant of the peak detector of FIG. 2 can be made even lower so as to enhance pulse-type transitions in the input signal.

Figure 3:
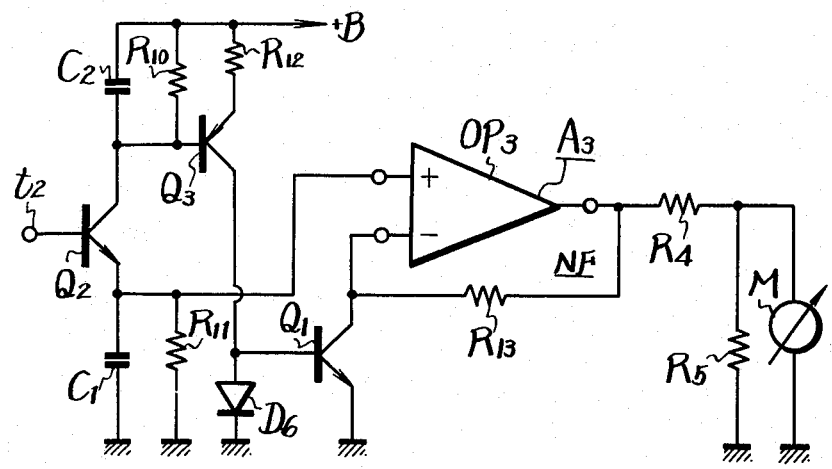
FIG. 3 is a schematic diagram of another embodiment of a peak detector in accordance with this invention.

Another embodiment of the peak detector in accordance with the teaching of this invention is schematically illustrated in FIG. 3. In the interest of simplification, the plural amplifying stages $A_1$ and $A_2$ are omitted from the FIG. 3 embodiment. As schematically shown, a peak detecting circuit is provided, including the base-emitter junction of a transistor $Q_2$ and the capacitor $C_1$. The base electrode of the transistor $Q_2$ is connected to an input terminal $t_2$ which is adapted to receive the output of an amplifier stage, such as the stage $A_2$ (not shown). The capacitor $C_1$ is connected in parallel with a resistor $R_{11}$ and is adapted to supply the voltage stored thereby to one of the input terminals of the operational amplifier $OP_3$ of the feedback amplifier stage $A_3$.

The output of the feedback amplifier is coupled through a voltage divider circuit to the peak level meter M in a manner substantially similar to that previously described with respect to FIG. 2. The negative feedback circuit NF which interconnects the output of the operational amplifier $OP_3$ to the inverting input thereof is formed of the resistor $R_{13}$. The resistor is adapted to be selectively coupled to ground by the transistor $Q_1$. Hence, as is apparent, when the transistor $Q_1$ is conductive, the resistor $R_{13}$ is effectively connected between the amplifier output and ground, to thus interrupt the feedback path established for the amplifier and to correspondingly increase the amplification factor thereof.

Control over the conductivity of the transistor $Q_1$ is effected by a capacitor $C_2$ and a further transistor $Q_3$. As shown, the capacitor $C_2$ is disposed in series with the collector electrode of the transistor $Q_2$. Hence, a series circuit is formed between a source of operating potential +B, through the capacitor $C_2$, through the collector-emitter circuit of the transistor $Q_2$ and through the capacitor $C_1$. The voltage across the capacitor $C_2$, which appears at the collector electrode of the transistor $Q_2$, is supplied to the base electrode of the transistor $Q_3$ which is shown as a PNP transistor. The resistors $R_{10}$ and $R_{11}$, as illustrated, serve to bias the transistor $Q_3$. An emitter resistor $R_{12}$ connects the emitter electrode of the transistor $Q_3$ to the source of operating potential and the collector electrode of this transistor is connected to ground by a diode $D_6$. The purpose of the diode $D_6$ is to provide a substantially constant voltage to the base electrode of the transistor $Q_1$ when the transistor $Q_3$ is conducting.

It is recognized that the emitter current of the transistor $Q_2$ is substantially equal to the collector current thereof so that the current which flows through the capacitor $C_2$ is proportional to the current which flows through the capacitor $C_1$. It is appreciated that the emitter current of the transistor is determined by the capacitance of the capacitor $C_1$ and the rate of change or the input voltage, so that the emitter current may be represented as $C_1 dV/dt$. Since the current flowing through the capacitor $C_2$ is proportional to this emitter current, then the voltage across the capacitor $C_2$, which is equal to the collector voltage of the transistor $Q_2$ is a function of $(C_1/C_2)(dV/dt)$, where $C_2$ is the capacitance of the capacitor $C_2$. Only negligible current flows through the resistors $R_{10}$ and $R_{11}$.

It is recognized that if the input signal undergoes a very rapid variation, the expression $(dV/dt)$ is large. Consequently, the voltage across the capacitor $C_2$ is large to thereby provide a large base-emitter potential across the transistor $Q_3$. Hence, the current through the transistor $Q_3$ is a function of the rate of change of the input voltage $(dV/dt)$ to thereby correspondingly vary the conductivity (and thus the impedance) of the transistor $Q_1$. When the transistor $Q_1$ is turned ON in response to this high rate of change of the input signal, the feedback path of the operational amplifier $OP_3$ established by the resistor $R_{13}$ is interrupted. Consequently, the amplification factor of the amplifier stage $A_3$ is increased to thereby enhance the rise-time portion of the input signal which is being applied to the transistor $Q_2$. As has been described hereinabove with respect to the embodiment of FIG. 2, this enhanced rise-time portion of the input signal is supplied to the meter M to thereby deflect the indication needle so that the meter provides a proportionate indication of the abrupt change in the peak level of the input signal.

When the transistor $Q_1$ is rendered conductive, the voltage at the amplifier output is equal to the sum of the voltage at the inverting input terminal thereof and the voltage across the feedback circuit. That is, the amplifier output voltage is equal to the product of the current flowing through the transistor $Q_1$ (and thus through the resistor $R_{13}$) and the resistance value of the resistor $R_{13}$ plus the voltage now present at the non-inverting input terminal of the amplifier. Consequently, as the transistor $Q_1$ is rendered more conductive in response to the increase in the current flowing through the capacitor $C_2$ which, in turn, is proportional to the increase in the current flowing through the capacitor $C_1$, the latter current being a function of the rate of change of the input voltage $dV/dt$, the amplification factor of the amplifier $A_3$ is increased. Thus, since the transistor $Q_2$ permits only the rise-time portion of the input signal peaks to be supplied to the capacitor $C_1$, only this rise-time portion is enhanced. The rise-time constant of the illustrated circuit can be changed so as to enhance more rapidly changing input signal peaks by changing the valve of the resistor $R_{10}$ and/or the value of the capacitor $C_2$. Nevertheless, since these elements are not in the direct signal path between the audio signal input and the meter M, changes in the values thereof will not affect the meter indications for audio signals which do not undergo such rapid changes. Thus, further adjustments to the OdB control and to the meter scale control need not be effected for each adjustment to the rise-time constant. As a consequence thereof, the meter M is enabled to provide a proportionate indication of the abrupt changes in the audio signal peaks as well as accurate indications of the slower variations in such signal peaks.

Figure 4:
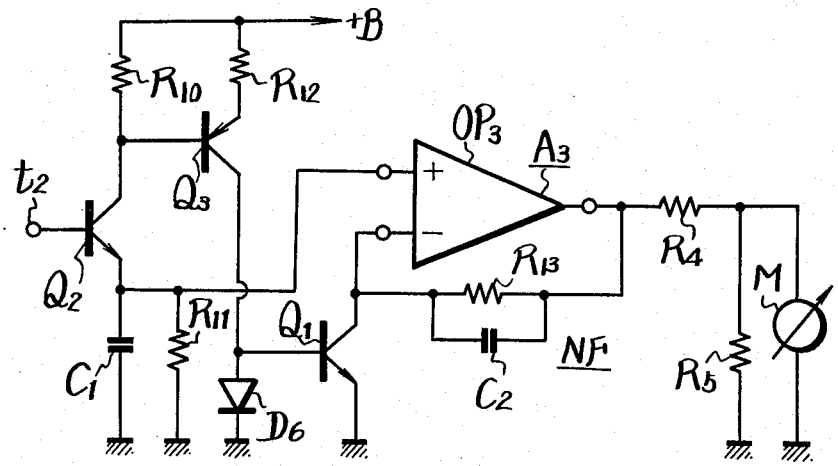
FIG. 4 is a schematic diagram of yet another embodiment of a peak detector in accordance with this invention.

A further embodiment of a peak detector in accordance with the teachings of this invention is schematically illustrated in FIG. 4. The FIG. 4 embodiment is similar to the aforedescribed FIG. 3 embodiment with the following changes: The capacitor $C_2$ is not connected in parallel with the resistor $R_{10}$ but, instead, is connected in parallel with the feedback resistor $R_{13}$. It is recognized that the voltage across the resistor $R_{10}$, which is identical to the voltage at the collector electrode of the transistor $Q_2$, is a function of the current which flows through the capacitor $C_1$. Thus, since this current is significantly increased in accordance with abrupt changes in the input signal $(dV/dt)$, such abrupt changes are detected and are used to correspondingly increase the conductivity of the transistor $Q_3$. As the transistor $Q_3$ is rendered more conductive, the transistor $Q_1$ likewise is rendered more conductive. Hence, it is seen that the collector-emitter current of the transistor $Q_1$ is a function of the current flowing through the collector emitter circuit of the transistor $Q_2$, and thus through the capacitor $C_1$. By turning ON the transistor $Q_1$, the current flowing through the feedback circuit, and especially through the capacitor $C_2$, is correspondingly increased. Thus, it is seen that the current flowing through the capacitor $C_2$ is a function of the current flowing through the capacitor $C_1$ when the feedback path is varied by the conductivity of the transistor $Q_1$ in response to abrupt changes in the rise-time portion of the input signals. As the transistor $Q_1$ becomes further conductive, the feedback circuit is effectively shunted to ground to thereby increase the amplification factor of the amplifier $A_3$ in much the same manner as was described previously with respect to FIGS. 2 and 3.

It is appreciated that the rise-time constant of the illustrated circuit can be varied by changing the values of the resistor $R_{10}$ and/or the capacitor $C_2$. Thus, input signals having steeper rise-time portions can be accommodated by the circuit and enhanced to thereby cause the indicating needle of the meter M to be deflected so as to provide a proportionate indication of such rise-time portions. Nevertheless, by varying the values of these components, the meter still provides an accurate indication of an input signal peak that does not undergo an abrupt change, without requiring a compensating adjustment in the OdB control and/or the meter scale control. Hence, the meter will accurately indicate both slowly varying signal peaks and abrupt changes in the signal peaks.

From the foregoing explanation, it should be readily apparent that the current flowing through the capacitor $C_2$ is a function of the current which flows through the capacitor $C_1$. Also, the rise-time portion of an input signal is enhanced by reason of the voltage across the capacitor $C_2$ which is added to the output of the amplifier $A_3$ in response to abrupt changes in the input signal peaks. Therefore, only the rise-time portion of an input signal having a large rate of change, i.e., a large $dV/dt$ component, will be enhanced. Moreover, the sensitivity of the peak detector to steeper rise times can be adjusted without causing changes in the meter indications when a slower varying input signal is supplied. Thus, rise-time adjustments can be easily and readily made without requiring additional adjustments in the meter driving circuit to compensate therefor. Hence, although the rise-time enhancement might not be needed for a small value of $dV/dt$ in the input signal, the meter, nevertheless, is capable of following and accurately indicating both small and large changes in such input signals.

While the present invention has been particularly described in connection with certain preferred embodiments, it should be readily appreciated that various changes and modifications in form and detail are contemplated. In addition, the particular application of the peak detector as disclosed herein need not be limited solely for use with a peak level meter. Indeed, the present invention can be readily used to drive any selected circuit which otherwise might not be capable of following abrupt changes in an input signal. Thus, other load devices, such as a DC motor, or the like, can be substituted for the meter M. Thus, it is intended that the appended claims be interpreted as including these as well as other such changes and modifications in structure and application.

What is claimed is:

1. A peak detector having a rise-time enhancement of input signals, comprising a feedback amplifier comprised of an operational amplifier having first and second input terminals, an output terminal and feedback means interconnecting said output terminal with one of said input terminals; a load connected to said output terminal; a peak detecting circuit including a capacitor coupled to the other of said input terminals, said capacitor being charged by signals of a predetermined polarity; means for supplying an input signal to said peak detecting circuit; and means coupled to said peak detecting circuit and responsive to abrupt changes in the rise-time portion of the signals applied to said capacitor to vary the impedance of said feedback means so as to enhance the signal at the output terminal of said feedback amplifier by increasing the gain thereof during said rise-time portion.

2. A peak detector in accordance with claim 1 wherein said feedback means comprises variable impedance means, said variable impedance means being varied by said means responsive to abrupt changes in the rise-time portion of signals for changing the output voltage produced at said feedback amplifier output terminal.

3. A peak detector in accordance with claim 2 wherein said feedback means further comprises a fixed impedance, said variable impedance means comprising transistor means coupled between said fixed impedance and a reference potential for selectively interrupting the feedback path between said feedback amplifier output terminal and said one input terminal.

4. A peak detector in accordance with claim 1 wherein said means responsive to abrupt changes in the rise-time portion of signals comprises a second capacitor coupled to said first capacitor.

5. A peak detector in accordance with claim 4 wherein said second capacitor is included in a differentiating circuit for detecting abrupt voltage changes and for applying an impedance varying signal to said feedback means in accordance with said detected abrupt voltage changes.

6. A peak detector in accordance with claim 4 wherein said second capacitor is included in a circuit through which flows a current that is a function of the current flowing through said first-mentioned capacitor, said circuit varying said feedback means in accordance with said current flowing therethrough.

7. A peak detector in accordance with claim 6 wherein said circuit comprises a first transistor, said first-mentioned capacitor and said second capacitor being connected in series with the collector-emitter circuit of said first transistor; and a second transistor coupled to said second capacitor and actuated thereby in accordance with the current flowing through said second capacitor, said second transistor being connected to said feedback means for varying same.

8. A peak detector in accordance with claim 1 wherein said feedback means includes a second capacitor, said second capacitor having a current flowing therethrough that is a function of the current flowing through said first-mentioned capacitor when the impedance of said feedback means is varied by said means responsive to abrupt changes in the rise-time portion of signals.

9. A peak detector in accordance with claim 8 wherein said means responsive to abrupt changes in the rise-time portion of signals comprises a first transistor having a collector-emitter circuit connected in series with said first capacitor; and a second transistor coupled to said first transistor and actuated in accordance with the current flowing through said first capacitor, said second transistor being coupled to said feedback means for varying the current flowing therethrough.

10. A peak detector in accordance with claim 9, further comprising a third transistor actuated by said second transistor for selectively shunting said feedback means to a reference point so as to interrupt the feedback path between said feedback amplifier output terminal and said one input terminal.

11. A peak detector circuit having rise-time enhancement of input signals, comprising an amplifier; gain determining means coupled to said amplifier; a peak detecting circuit coupled to an input of said amplifier; means for supplying an input signal to said peak detecting circuit; and means coupled to said peak detecting circuit and responsive to abrupt changes in the rise-time portion of said input signals to vary said gain determining means such that the gain of said amplifier is increased for a duration corresponding to said input signal rise-time portion to enhance the signal at the output of said amplifier during said rise-time portion.

12. A peak detector circuit in accordance with claim 11 wherein said amplifier comprises an operational amplifier; said gain determining means comprises an impedance in a feedback circuit connected to said operational amplifier; and said means to vary said gain determining means comprises means for effectively disconnecting said feedback circuit from said operational amplifier.

* * * * *